United States Patent
Chen et al.

(10) Patent No.: US 10,784,303 B2
(45) Date of Patent: Sep. 22, 2020

(54) METHOD OF MANUFACTURING A CMOS IMAGE SENSOR

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Fugang Chen, Shanghai (CN); Wenlei Chen, Shanghai (CN); Jie Ru, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 138 days.

(21) Appl. No.: 15/382,302

(22) Filed: Dec. 16, 2016

(65) Prior Publication Data
US 2017/0207270 A1 Jul. 20, 2017

(30) Foreign Application Priority Data
Jan. 15, 2016 (CN) .......................... 2016 1 0025386

(51) Int. Cl.
H01L 31/062 (2012.01)
H01L 27/146 (2006.01)

(52) U.S. Cl.
CPC .... H01L 27/14654 (2013.01); H01L 27/1463 (2013.01); H01L 27/14636 (2013.01); H01L 27/14689 (2013.01)

(58) Field of Classification Search
CPC ........... H01L 27/1463; H01L 27/14636; H01L 27/14654; H01L 27/14689
(Continued)

(56) References Cited

U.S. PATENT DOCUMENTS

| 4,760,273 A | * | 7/1988 | Kimata | ............. H01L 27/14831 250/208.1 |
| 5,051,798 A | * | 9/1991 | Kimura | ............. H01L 27/14887 257/224 |

(Continued)

FOREIGN PATENT DOCUMENTS

EP        1770784        4/2007

OTHER PUBLICATIONS

European Application No. 17150401.2, Partial European Search Report dated Jun. 2, 2017, 12 pages
(Continued)

*Primary Examiner* — Jay C Kim
(74) *Attorney, Agent, or Firm* — Kilpatrick Townsend & Stockton LLP (57) ABSTRACT

A CMOS image sensor includes a semiconductor substrate, a plurality of pixel regions in the semiconductor substrate, a deep trench disposed between two adjacent pixel regions and filled with a polysilicon layer doped a first conductivity type, a plurality of well regions having a second conductivity type in each of the pixel regions, a through hole connected to the polysilicon material, and an metal interconnect layer connected to the through hole. The deep trench filled with the doped polysilicon layer completely isolates adjacent pixel regions. A voltage applied to the metal intercon-
(Continued)

nect layer extracts excess photoelectrons generated by intensive incident light to improve the performance of the CMOS image sensor.

15 Claims, 7 Drawing Sheets

(58) Field of Classification Search
USPC .......................................................... 257/292
See application file for complete search history.

(56) References Cited

U.S. PATENT DOCUMENTS

| | | | | |
|---|---|---|---|---|
| 5,239,193 | A * | 8/1993 | Benton | H01L 27/1443 257/292 |
| 5,877,521 | A * | 3/1999 | Johnson | H01L 27/14603 257/223 |
| 5,936,270 | A * | 8/1999 | Kamada | H01L 27/14643 257/291 |
| 6,229,194 | B1 * | 5/2001 | Lizotte | H01L 21/763 136/249 |
| 6,611,037 | B1 * | 8/2003 | Rhodes | H01L 27/14601 257/462 |
| 6,642,561 | B2 * | 11/2003 | Kakumoto | H01L 27/14609 257/292 |
| 6,696,349 | B2 * | 2/2004 | Vollrath | H01L 21/763 257/E21.572 |
| 6,888,214 | B2 * | 5/2005 | Mouli | H01L 27/14601 257/222 |
| 6,943,409 | B1 * | 9/2005 | Cheng | B82Y 20/00 257/330 |
| 6,946,352 | B2 * | 9/2005 | Yaung | H01L 27/14603 257/E27.131 |
| 6,967,316 | B2 * | 11/2005 | Lee | H01L 27/1463 250/208.1 |
| 7,060,960 | B2 * | 6/2006 | Ohta | G01J 1/44 250/208.1 |
| 7,122,840 | B2 * | 10/2006 | Hsu | H01L 27/1462 257/80 |
| 7,205,627 | B2 * | 4/2007 | Adkisson | H01L 27/14609 250/208.1 |
| 7,217,968 | B2 * | 5/2007 | Adkisson | H01L 27/14601 257/232 |
| 7,235,826 | B2 * | 6/2007 | Ezaki | H01L 27/14603 257/225 |
| 7,250,321 | B2 * | 7/2007 | Rhodes | H01L 27/14601 257/E27.131 |
| 7,297,995 | B2 * | 11/2007 | Mouli | H01L 27/1463 257/291 |
| 7,459,668 | B2 * | 12/2008 | Mauritzson | H01L 27/1463 250/214.1 |
| 7,485,939 | B2 * | 2/2009 | Tanaka | H01L 27/14609 257/291 |
| 7,492,027 | B2 * | 2/2009 | Mouli | H01L 27/1463 257/233 |
| 7,518,172 | B2 * | 4/2009 | Moon | H01L 27/14625 257/292 |
| 7,535,037 | B2 * | 5/2009 | Lyu | H01L 27/14603 257/215 |
| 7,626,685 | B2 * | 12/2009 | Jin | G01C 3/08 257/290 |
| 7,652,313 | B2 * | 1/2010 | Ellis-Monaghan | H01L 27/14634 257/291 |
| 7,659,564 | B2 * | 2/2010 | Adkisson | H01L 27/1463 257/293 |
| 7,696,544 | B2 * | 4/2010 | Misaki | H01L 27/14603 257/291 |
| 7,855,407 | B2 * | 12/2010 | Shim | H01L 27/14603 257/290 |
| 8,022,452 | B2 * | 9/2011 | Wang | H01L 31/02164 257/223 |
| 8,049,256 | B2 * | 11/2011 | Guidash | H01L 27/14634 257/292 |
| 8,115,848 | B2 * | 2/2012 | Onuki | H01L 27/14609 348/308 |
| 8,247,262 | B2 * | 8/2012 | Huang | H01L 21/28518 257/E21.636 |
| 8,247,854 | B2 * | 8/2012 | Kang | H01L 27/1461 257/292 |
| 8,310,003 | B2 * | 11/2012 | Kohyama | H01L 27/14603 257/215 |
| 8,339,494 | B1 * | 12/2012 | McCarten | H01L 27/14609 257/292 |
| 8,357,984 | B2 * | 1/2013 | Mao | H01L 27/1464 257/447 |
| 8,390,089 | B2 * | 3/2013 | Chen | H01L 27/1464 257/447 |
| 8,440,490 | B2 * | 5/2013 | Adkisson | H01L 27/1463 257/E21.131 |
| 8,440,495 | B2 * | 5/2013 | Liu | H01L 27/14689 257/E21.551 |
| 8,445,944 | B2 * | 5/2013 | Ezaki | H01L 27/14603 257/233 |
| 8,471,313 | B2 * | 6/2013 | Takahashi | H01L 27/14609 257/292 |
| 8,492,865 | B2 * | 7/2013 | Venezia | H01L 27/1464 257/291 |
| 8,507,962 | B2 * | 8/2013 | Anderson | H01L 27/14603 257/292 |
| 8,519,456 | B2 * | 8/2013 | Masagaki | H01L 27/14609 257/291 |
| 8,531,567 | B2 * | 9/2013 | Roy | H01L 27/14603 348/296 |
| 8,564,135 | B2 * | 10/2013 | Pyo | H01L 23/481 257/432 |
| 8,614,759 | B2 * | 12/2013 | Watanabe | H01L 27/14603 348/315 |
| 8,686,342 | B2 * | 4/2014 | Hong | H01L 27/14609 250/208.1 |
| 8,704,282 | B2 * | 4/2014 | Marty | H01L 27/1463 257/292 |
| 8,785,991 | B2 * | 7/2014 | Mabuchi | H01L 27/14603 257/232 |
| 8,791,512 | B2 * | 7/2014 | Roy | H01L 27/14603 250/208.1 |
| 8,792,034 | B2 * | 7/2014 | Takahashi | H01L 27/14632 348/305 |
| 8,803,057 | B2 * | 8/2014 | Roy | H01L 27/14601 250/208.1 |
| 8,815,634 | B2 * | 8/2014 | Ramappa | H01L 27/14603 438/527 |
| 8,901,697 | B2 * | 12/2014 | Stenson | H01L 31/103 257/435 |
| 9,041,071 | B2 * | 5/2015 | Ahn | H01L 31/0232 257/225 |
| 9,054,007 | B2 * | 6/2015 | Hu | H01L 27/14643 |
| 9,087,755 | B2 * | 7/2015 | Frach | H01L 27/1443 |
| 9,117,723 | B2 * | 8/2015 | Ahn | H01L 27/14643 |
| 9,160,949 | B2 * | 10/2015 | Zhang | H04N 5/361 |
| 9,236,407 | B2 * | 1/2016 | Roy | H01L 27/14603 |
| 9,281,331 | B2 * | 3/2016 | Chen | H01L 27/14614 |
| 9,356,061 | B2 * | 5/2016 | Fan | H01L 27/14623 |
| 9,419,039 | B2 * | 8/2016 | Ahmed | H01L 27/1463 |
| 9,431,449 | B2 * | 8/2016 | Toda | H01L 27/14603 |
| 9,443,892 | B2 * | 9/2016 | Koo | H01L 27/14612 |
| 9,496,303 | B2 * | 11/2016 | Suzuki | H01L 27/1463 |
| 9,496,304 | B2 * | 11/2016 | Hu | H01L 27/14607 |
| 9,502,459 | B2 * | 11/2016 | Miyanami | H01L 27/14643 |
| 9,508,771 | B2 * | 11/2016 | Lee | H01L 27/14612 |
| 9,584,744 | B2 * | 2/2017 | Lenchenkov | H04N 5/359 |
| 9,647,016 | B2 * | 5/2017 | Oh | H01L 27/14603 |
| 9,653,507 | B2 * | 5/2017 | Chou | H01L 27/1463 |
| 9,917,124 | B2 * | 3/2018 | Cazaux | H01L 27/14605 |
| 10,515,988 | B2 * | 12/2019 | Tayanaka | H01L 27/0248 |
| 2005/0184353 | A1 | 8/2005 | Mouli | |
| 2006/0043525 | A1 | 3/2006 | Mouli | |
| 2007/0052056 | A1 * | 3/2007 | Doi | H01L 27/1463 257/462 |

(56) References Cited

U.S. PATENT DOCUMENTS

| | | | |
|---|---|---|---|
| 2008/0102557 A1* | 5/2008 | Kim ................. | H01L 21/76224 |
| | | | 438/73 |
| 2012/0043589 A1* | 2/2012 | Nozaki ............. | H01L 27/14603 |
| | | | 257/225 |
| 2012/0280109 A1* | 11/2012 | Mao .................... | H01L 27/1463 |
| | | | 250/208.1 |
| 2015/0295005 A1 | 10/2015 | Tseng et al. | |

OTHER PUBLICATIONS

European Application No. 17150401.2, Extended European Search Report dated Sep. 28, 2017, 13 pages.

* cited by examiner

METHOD OF MANUFACTURING A CMOS IMAGE SENSOR

CROSS-REFERENCES TO RELATED APPLICATIONS

This application claims priority to Chinese patent application No. 201610025386.0, filed on Jan. 15, 2016, the content of which is incorporated herein by reference in its entirety.

BACKGROUND OF THE INVENTION

The present invention relates to the field of integrated circuits, and more particularly to a CMOS image sensor and method of fabricating the CMOS image sensor.

An image sensor is able to receive information of an optical image and convert the information into an electric signal. Depending on the implementation principle, an image sensor is mainly classified into a charge coupled device (commonly known as a CCD image sensor) and a CMOS image sensor that is based on complementary metal-oxide semiconductor (CMOS) manufacturing technology. A CCD image sensor has an advantage in high sensitivity and low noise, but its main disadvantage is the difficulty of integration with other devices and high power consumption. In contrast, a CMOS image sensor can be fabricated using conventional CMOS manufacturing processes, it has the advantages of small size, light-weight, low power consumption, and low fabrication cost. Because a CMOS image sensor can be integrated with other peripheral circuits, the CMOS image sensor has a broad range of applications, such as in digital still cameras, camera phones, digital video cameras, medical imaging devices (e.g., gastroscopy), imaging applications in automotive and other areas.

Figure 1:
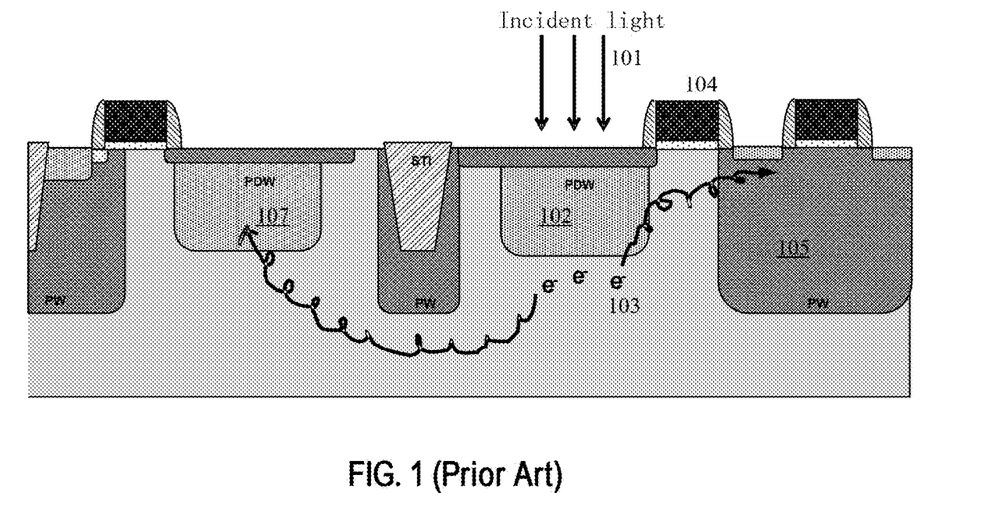
FIG. 1 is a cross-sectional view of a CMOS image sensor, as know in the prior art.

A CMOS image sensor generates electric signals in response to the stimulation of photoelectrons. The electric signals are then processed to produce corresponding image information. The isolation structure between pixels has a significant effect on the performance of the image sensor. FIG. 1 illustrates two different operations of an image sensor: in the normal operation mode photons 101 of incident light enters into a photodiode 102 are converted into photoelectrons 103, the majority of them are transmitted through a transistor 104 to a charge storage 105, and in the abnormal operation mode where some of the photoelectrons reach a photodiode 107 to generate incorrect image information.

Once an electrical signal of a photodiode affects one or more of its neighbors, the image is distorted. In order to effectively isolate photodiodes, current techniques generally promote a relatively deep ion implantation to implement isolation between adjacent photodiodes.

In view of the foregoing, there is a need for a novel CMOS image sensor device and method for manufacturing the same.

BRIEF SUMMARY OF THE INVENTION

Embodiments of the present invention overcome the aforementioned deficiencies by provide a novel CMOS image sensor which includes a semiconductor substrate, a plurality of pixel regions in the semiconductor substrate, a deep trench disposed between two adjacent pixel regions, a polysilicon material having a first conductivity type filling the deep trench, a plurality of well regions having a second conductivity type in each of the pixel regions, the first and second conductivity types being opposite conductivity types, a through hole connected to the polysilicon layer, and an metal interconnect layer connected to the through hole.

In one embodiment, the CMOS image sensor further includes an isolation structure disposed between two adjacent pixel regions. The isolation structure is disposed on an upper surface of the deep trench, and the through hole passes through the isolation structure.

In one embodiment, the CMOS image sensor also includes an isolation well having the first conductivity type and disposed between the two adjacent pixel regions. The isolation well surrounds a portion of the deep trench, the isolation well having a bottom that is higher than a bottom of the deep trench.

In one embodiment, the deep trench has a depth in a range between 2 microns and 3 microns.

In one embodiment, each of the pixel regions includes a photodiode and a plurality of transistors.

In one embodiment, the CMOS image sensor also includes a plurality of through holes each one is connected to one of the transistors.

In one embodiment, the CMOS image sensor also includes a pad oxide layer disposed on a bottom and sidewalls of the deep trench.

Embodiments of the present invention also a method for manufacturing a CMOS image sensor. The method includes providing a semiconductor substrate including a plurality of active regions and a plurality of pixel regions, removing a portion of the semiconductor substrate to form a deep trench between two adjacent pixel regions, filling the deep trench with a polysilicon layer doped with a first conductivity type, forming a shallow trench isolation structure in the semiconductor substrate between two active regions and on the polysilicon layer, and forming a plurality of well regions having a second conductivity type in the semiconductor substrate. The method also includes forming a plurality of front end devices on the active regions, forming a plurality of through holes, where some but not all of the through holes are electrically connected to the front end devices, and at least one through hole is connected to the polysilicon layer. The method also includes forming a metal interconnect layer connected to the at least one through hole.

In one embodiment, forming the deep trench includes forming a hard mask layer on the semiconductor substrate, patterning the hard mask layer to expose a surface of the semiconductor substrate, and performing an etching process on the exposed surface to remove the portion of the semiconductor substrate.

In one embodiment, filling the deep trench includes depositing the polysilicon layer in the deep trench and on the hard mask layer, planarizing the polysilicon layer until a surface of the hard mask layer is exposed, performing an etch-back on the planarized polysilicon layer to remove a portion of the polysilicon layer so that an upper surface of the polysilicon layer is lower than an upper surface of the hard mask layer, and removing the hard mask layer.

In one embodiment, the deep trench has a depth in a range between 2 microns and 3 microns.

In one embodiment, the method also includes, after forming the deep trench and prior to filling the deep trench, forming a pad oxide layer on a bottom and sidewalls of the deep trench. The pad oxide layer includes silicon oxide.

In one embodiment, forming the shallow trench isolation structure may include sequentially depositing a pad oxide layer and a pad nitride layer on the semiconductor substrate and on the polysilicon layer, performing an etching process on the pad nitride layer, the pad oxide layer and a portion of the semiconductor substrate to form a shallow trench, forming an insulating layer in the shallow trench and on the pad nitride layer, planarizing the insulating layer to expose a surface of the pad nitride layer, and removing the pad nitride layer.

In one embodiment, forming the plurality of front end devices may include forming a photodiode and a plurality of transistors in each of the pixel regions.

In one embodiment, the method may further include, prior to forming the plurality of front end devices, forming an isolation well having the first conductivity type and disposed between the two adjacent pixel regions. The isolation well surrounds a portion of the deep trench, the isolation well having a bottom that is higher than a bottom of the deep trench.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "higher", "lower", "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures. The term "chip" is used to refer to an integrated circuit device including logic devices, memory devices, various types of photodiodes, and various types of transistors.

As described in the background section, conventional image sensors have problems of low isolation between pixel regions. The present inventors studied the above problems and proposed a novel integrated device and method of manufacturing the same. According to the present invention, an integrated device includes a CMOS image sensor.

Embodiment 1

Figure 2:
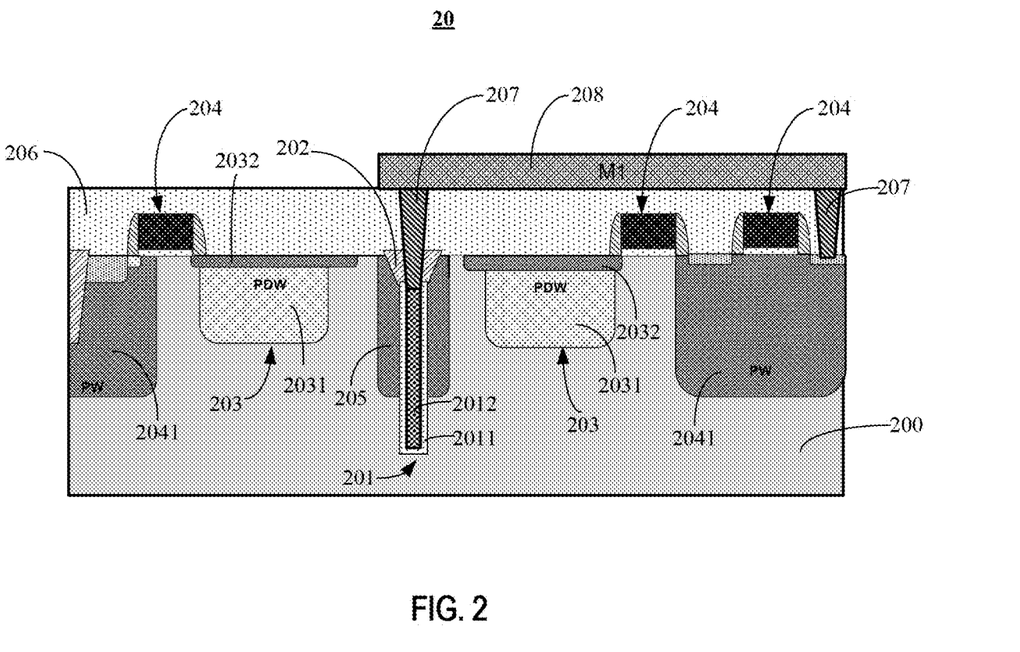
FIG. 2 is a cross-sectional view of a CMOS image sensor according to some embodiments of the present invention.

FIG. 2 illustrates a cross-sectional view of a CMOS image sensor according to one embodiment of the present invention.

Referring to FIG. 2, a CMOS image sensor 20 includes a semiconductor substrate 200, a plurality of pixel regions formed in semiconductor substrate 200, a plurality of second conductivity type well regions 2031, 2041 in the pixel regions, a deep trench 201 in semiconductor substrate 200 between two adjacent pixel regions, a first conductivity type doped polysilicon 2012 in deep trench 201, a through hole 207 on the semiconductor substrate configured to connect to polysilicon 2012, and an interconnect metal layer 208 configured to connect to through hole 207.

In one embodiment, semiconductor substrate 200 may include silicon on insulator (SOI), stacked SOI (SSOI), stacked SiGe on insulator (S—SiGeOI), SiGeOI, and combinations thereof. Semiconductor substrate 200 may include a variety of active regions. In an example embodiment, semiconductor substrate 200 may include a second conductivity type substrate.

In the embodiment, the first conductivity type and the second conductivity type refer to opposite conductivity types such as P or N-type. If the first conductivity type is N-type, the second conductivity type is P-type. Conversely, if the first conductivity type is P-type, the second conductivity type is N-type.

Semiconductor substrate 200 includes a plurality of pixel regions, each of the pixel regions may include a photodiode 203 and multiple transistors 204. In one example, photodiode 203 includes a second conductivity type well region 2031 and a first conductivity type doped region 2032. The first and second conductivity types are opposite conductivity types. Second conductivity type well region 2031 and first conductivity type doped region 2032 form a PN junction of a photodiode, which generates electrical charges in response to incident light. According to application requirements, the number of transistors can be three, four or more.

In the example embodiment, the CMOS image sensor is a four-transistor image sensor, which includes a photodiode 203 and four transistors 204 (only a portion is shown). The four transistors may include a transfer transistor, a reset transistor, a drive transistor, and a select transistor. The CMOS image sensor may also include a floating diffusion region (not shown) configured to receive electrons from the photodiode and convert the electrical charges into voltage signals.

The transfer transistor is disposed on one side of the photodiode and includes a gate structure disposed on the semiconductor substrate. Further, the gate structure may include a gate dielectric layer and a gate material sequentially disposed on the semiconductor substrate. In addition, the transfer transistor may include spacers disposed on sidewalls of the gate structure.

Each of the reset transistor, drive transistor, and select transistor includes a gate structure is formed on the semiconductor substrate. A doped source region and a doped drain region having a same conductivity type as well regions 2031 are disposed on opposite sides of the gate structure. In other words, the source and drain regions have a second conductivity type. In the embodiment, when well regions 2031 are an N-type, the source and drain regions are also N-type. In addition, a lightly doped drain may also be formed in a region between the gate and the source and drain regions according to product specifications and functional requirements. Furthermore, spacers may be formed on sidewalls of the gate structure.

The gate dielectric layer on the semiconductor substrate may include any conventional dielectric material, e.g., silicon oxide, silicon nitride or silicon oxynitride having a dielectric constant of about 4 to 20 (measured in vacuum). The gate dielectric layer may also include dielectric materials having a higher dielectric constant in the range between about 20 to 100. The dielectric materials having such a high dielectric constant may include but not limited to hafnium oxide, hafnium silicate, titanium oxide, barium strontium titanate (BST) and lead zirconate titanate (PZT). The gate material layer may include a variety of materials comprising but not limited to metal, metal alloy, metal nitride and metal silicide, stacks and composites thereof. The gate material layer may also include doped polysilicon and polycrystalline silicon-germanium alloy (i.e., having a doping concentration of $1\times10^{18}$ atoms/cm$^3$ to about $1\times10^{22}$ atoms/cm$^3$) and polysilicon metal silicide (polycide) (a stack of doped polysilicon metal silicide).

The CMOS image sensor includes a deep trench 201 disposed between two adjacent pixel regions in semiconductor substrate 200, and a first conductivity type doped polysilicon 2012 filling deep trench 201.

In one example embodiment, a liner layer 2011 is formed under polysilicon 2012. Liner layer 2011 may include any suitable insulating material, such as silicon oxide, silicon oxynitride, or the like. In the embodiment, liner layer 2011 includes silicon oxide.

In one embodiment, deep trench 201 has a depth of about 2 to 3 microns. Polysilicon 2012 is doped with the first conductivity type impurity (dopant). When the first conductivity type is an N-type, the N-type impurity (dopant) may be phosphorus, arsenic, antimony or a combination thereof. When the first conductivity type is a P-type, the P-type impurity (dopant) may be boron, aluminum, gallium, and the like.

Semiconductor substrate 200 further includes an isolating structure 202 in semiconductor substrate 200. In one embodiment, isolating structure 202 is disposed between the pixel regions. Isolating structure 202 is preferably a shallow trench isolation structure comprising a shallow trench in semiconductor substrate 200, a liner layer on the sidewalls and the bottom of the shallow trench and an insulating material filling the shallow trench. The liner material may be an oxide or oxynitride. In the embodiment, the liner layer includes silicon oxide. The insulating material may include silicon oxide.

In one embodiment, isolation structure 202 has a bottom portion that is disposed at the top portion of deep trench 201, and the top portion of deep trench 201 is below the top surface of semiconductor substrate 200.

In one embodiment, semiconductor substrate 200 further includes an isolation well 205 of the first conductivity type disposed between adjacent pixel regions in semiconductor substrate 200. Isolation well 205 is configured to isolate the adjacent pixel regions. Further, isolation well 205 surrounds a portion of deep trench 201 and has a bottom portion higher than the bottom of deep trench 201. The isolation well has a conductivity type that is opposite the conductivity type of its neighboring wells, e.g., isolation well 205 has a conductivity type that is opposite of the conductivity type of well regions 2031.

The CMOS image sensor according to the present invention further includes a through hole 207 connected to polysilicon 2012 and an interconnect metal layer 208 connected to though hole 207.

The CMOS image sensor also includes a dielectric layer 206 on semiconductor substrate 200. In one embodiment, though hole 207 is disposed between the adjacent pixel regions and passing through dielectric layer 206 and connected to polysilicon 2012 that is filling deep trench 201.

In one embodiment, the CMOS image sensor further includes multiple through holes 207 that are electrically connected to the transistors in each pixel region, and the through holes are also connected to metal interconnect layer 208.

Metal interconnect layer 208 may include multiple metal layers that are electrically connected to each other to form a metal interconnect structure.

In one embodiment, through hole 207 may include any suitable electrically conductive material, such as W, Cu or Al.

In summary, in accordance with the present invention, the CMOS image sensor includes a deep trench disposed between two adjacent pixel regions and filled with a doped polysilicon. The deep trench completely isolates the adjacent pixel regions, so that excess photoelectrons generated by intensive incident light will be collected by the doped polysilicon and will not impact adjacent pixel regions. In addition, the excess photoelectrons in the doped polysilicon will be extracted away by a specific voltage applied to the metal interconnect structure that is connected to the doped polysilicon through the through hole, thereby improving the performance of the CMOS image sensor.

Embodiment 2

Figure 3A:
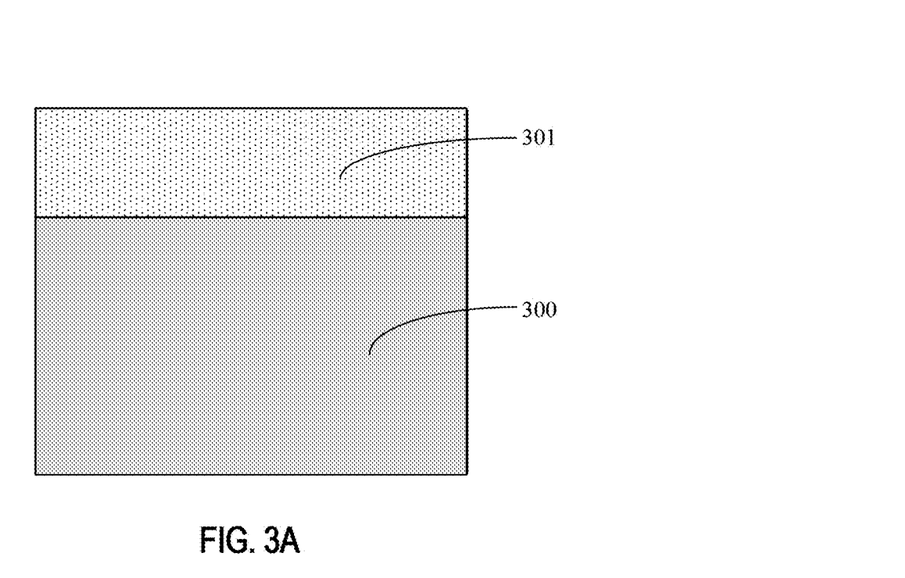
FIGS. 3A-3K are cross-sectional views illustrating intermediate stages of manufacture according to embodiments of the present invention.
Figure 3B:
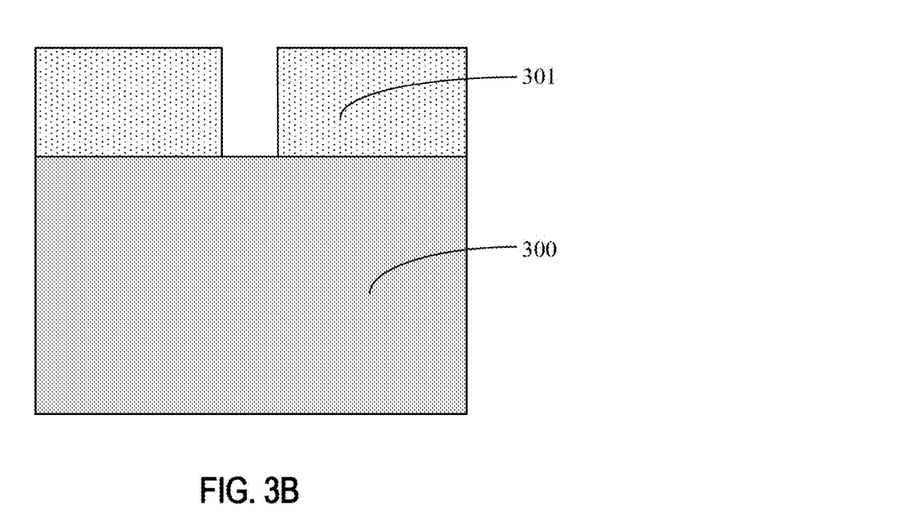
Figure 3C:
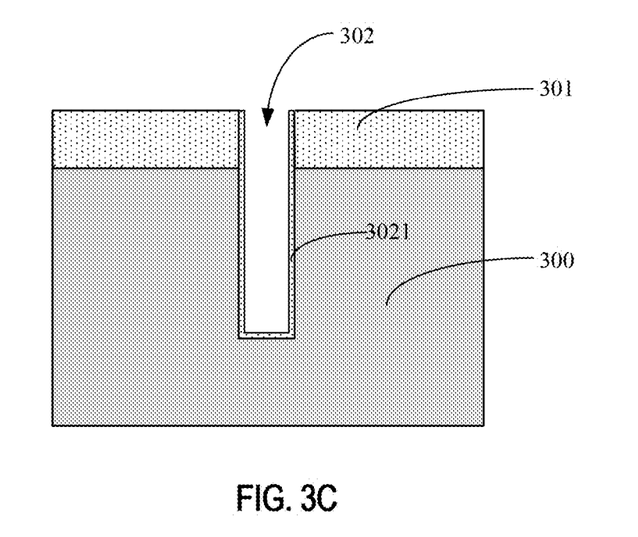
Figure 3D:
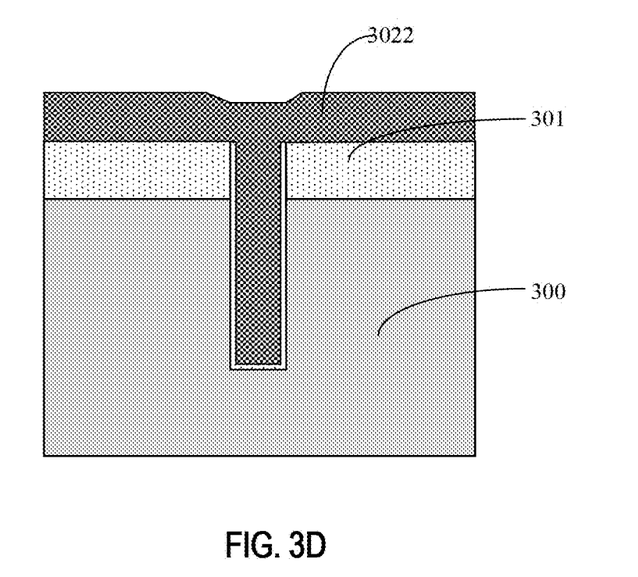
Figure 3E:
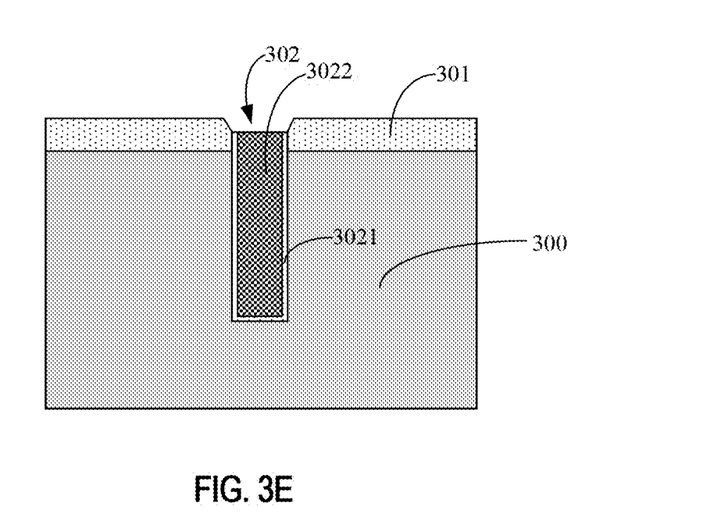
Figure 3F:
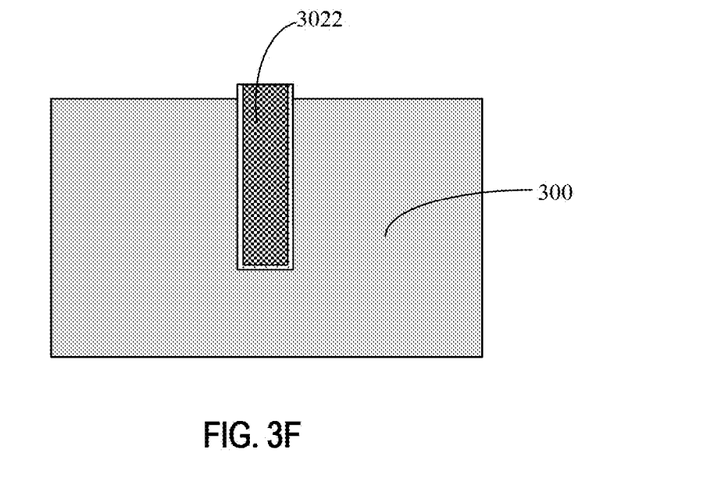
Figure 3G:
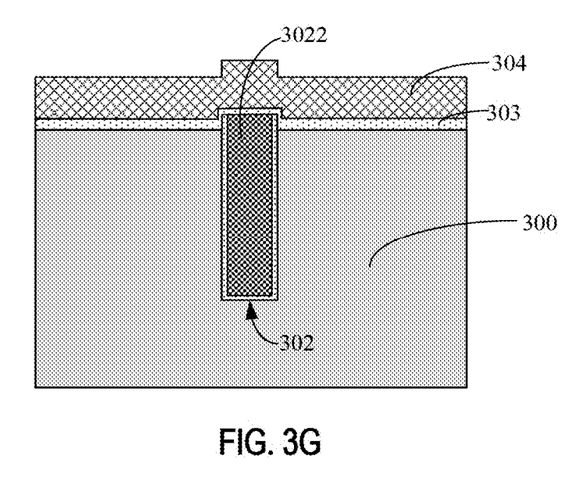
Figure 3H:
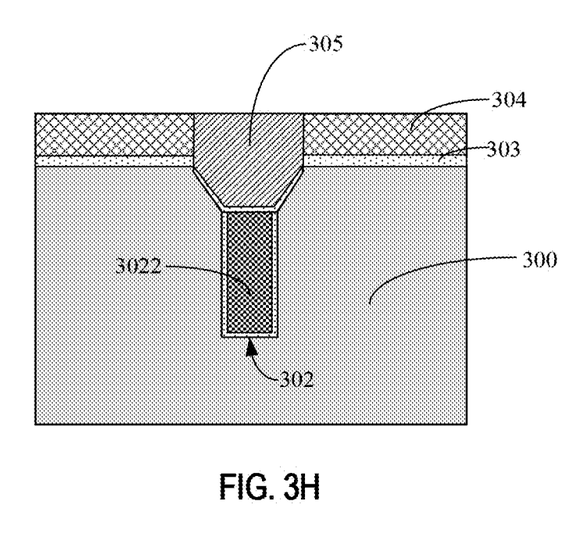
Figure 3I:
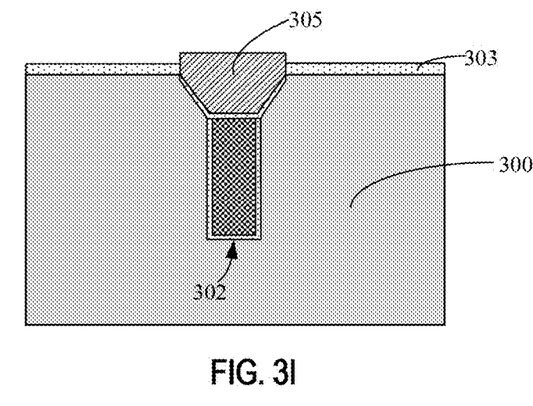
Figure 3J:
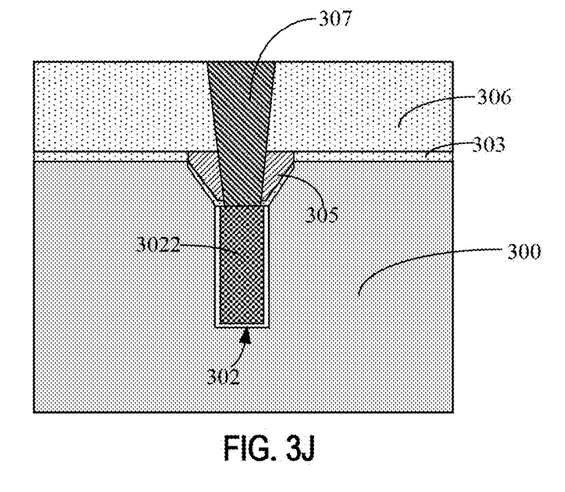
Figure 3K:
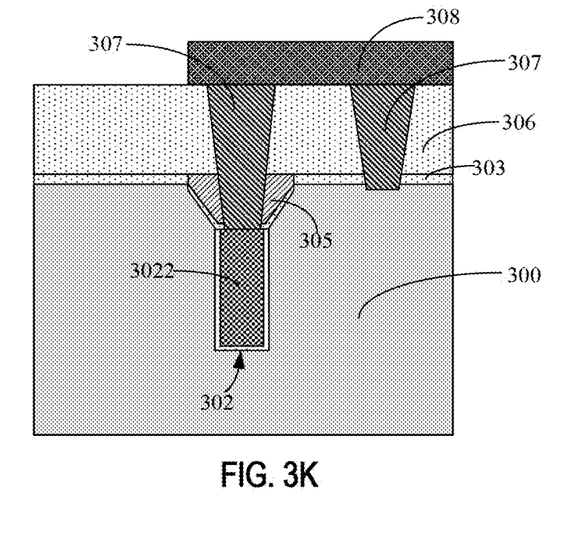
Figure 4:
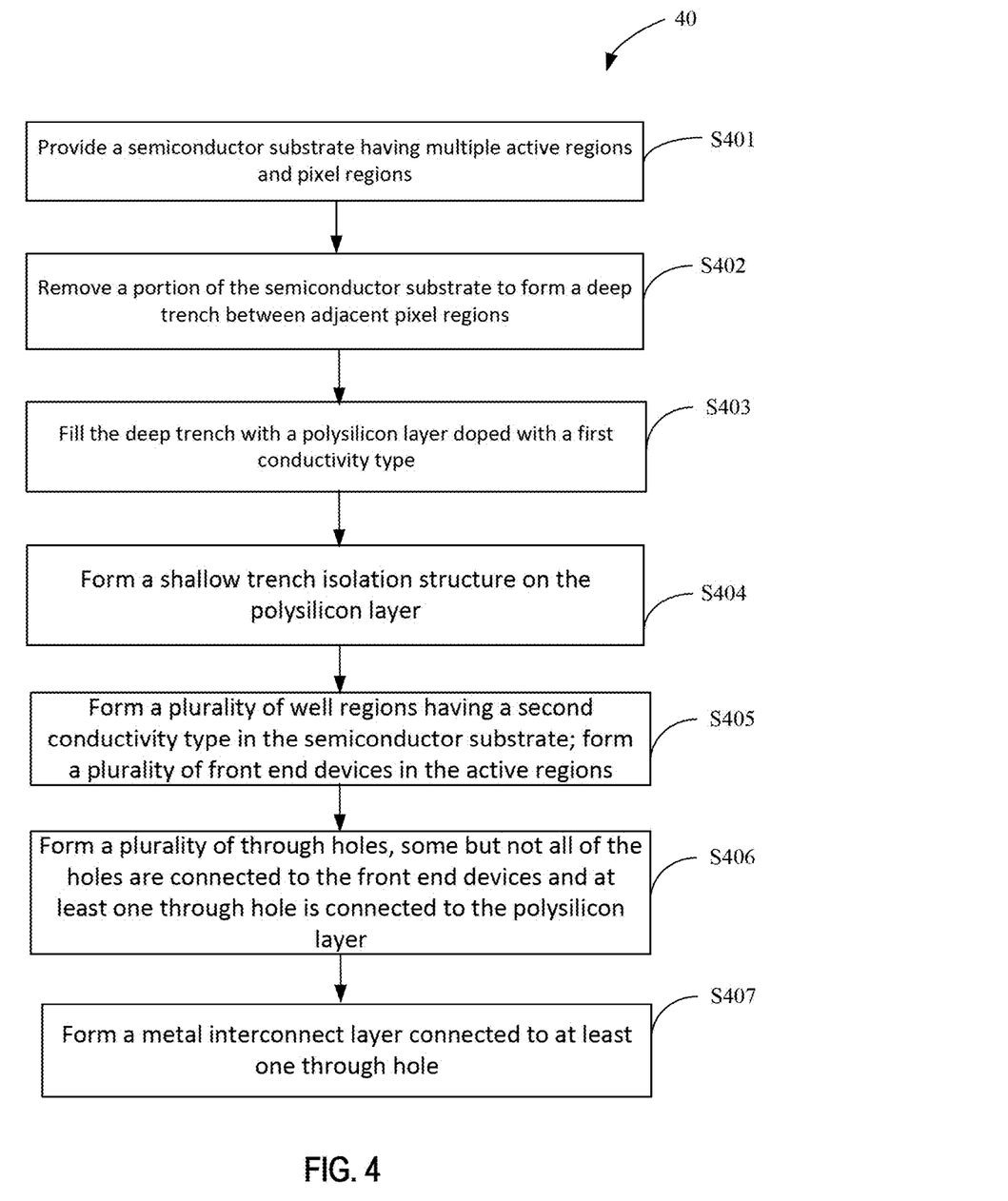
FIG. 4 is a flowchart of a method for manufacturing a semiconductor device according to one embodiment of the present invention.

Referring to FIGS. 3A through 3K and FIG. 4, a method for manufacturing a CMOS image sensor will be described. FIGS. 3A-3K are cross-sectional views of intermediate stages of manufacture according to embodiments of the present invention. FIG. 4 is a flowchart of a method for manufacturing a semiconductor device according to one embodiment of the present invention.

Referring to FIG. 4, the method 40 may include the following steps:

S401: provide a semiconductor substrate comprising a plurality of active regions and pixel regions.

Referring to FIG. 3A, a semiconductor substrate 300 is provided. Semiconductor substrate 300 may be one of silicon on insulator (SOI), stacked SOI (SSOI), stacked SiGe on insulator (S—SiGeOI), SiGeOI, and SiGe. In one embodiment, semiconductor substrate 300 may include a second conductivity type substrate. Semiconductor substrate 300 may include multiple active regions and pixel regions.

S402: perform an etching process to form a deep trench between adjacent pixel regions in the semiconductor substrate.

In one embodiment, referring to FIGS. 3A to 3C, the deep trench can be formed with the following steps:

A hardmask layer 301 is formed on semiconductor substrate 300, as shown in FIG. 3A. Hardmask layer 301 may include any suitable material, such as nitride, oxide, silicon oxynitride, silicon nitride, and the like. In the embodiment, hardmask layer 301 includes silicon oxide that is formed using a commonly used deposition process, such as a chemical vapor deposition and physical vapor deposition process.

Referring to FIG. 3B, hardmask layer 301 is patterned to expose a portion of the semiconductor substrate between adjacent pixel regions. Lithography and etching processes may be performed to form a pattern for a certain target critical dimension of a deep trench.

Next, referring to FIG. 3C, the exposed portion of semiconductor substrate 300 is etched to form a deep trench 302 between adjacent pixel regions using the patterned hardmask layer as a mask. The etching process can be an wet etching or a dry etching process. The dry etching process may include a reactive ion etching (ME), ion beam etching, plasma etching or laser cutting process. In one embodiment, the etching process may include one or more RIE processes so that deep trench 302 has a depth in the range between 2 and 3 µm.

S403: forming a polysilicon doped with the first conductivity type impurity to fill the deep trench.

In one embodiment, as shown in FIG. 3C, before forming the doped polysilicon, step S403 may include forming a spacer layer 3021 on the bottom and sidewalls of deep trench 302. Spacer layer 3021 may include any suitable insulating material, such as silicon oxide, silicon oxynitride, and the like. In the embodiment, spacer layer 3021 includes silicon oxide that is formed using a chemical vapor deposition or physical vapor deposition process.

In an example embodiment, forming the polysilicon doped with the first conductivity type impurity may include the following steps:

Referring to FIG. 3D, a polysilicon layer 3022 doped with the first conductivity type impurity is formed in deep trench 302 and on patterned hardmask layer 301. Polysilicon layer 3022 is then planarized until a surface of hardmask layer 301 is exposed.

Polysilicon layer 3022 may be formed using any known techniques, such as a low pressure chemical vapor deposition (LPVCD) process using silane ($SiH_4$) as a reaction gas, a silane flow rate in the range between 100 and 200 $cm^3$ per minute (sccm), preferably 150 sccm, at the reaction chamber temperature in the range between 700 to 750 degrees C., a pressure between 250 and 350 mTorr, preferably 300 mTorr. The reaction chamber may also include a buffer gas, such as helium or nitrogen having a flow rate in the range between 5 and 20 liters per minute (slm), e.g., 8 slm, 10 slm, or 15 slm. When the first conductivity type is the N-type, phosphine ($PH_3$) or arsine ($AsH_3$) and other materials may be provided during the deposition process, so that doped polysilicon layer 3022 includes N-type dopants such phosphorus (P) or arsenic (As) or a combination of N-type dopants. When the first conductivity type is the P-type, dopant species such as $BF_2$ may be provided during the deposition process, so that polysilicon 303 includes P-type dopants such as boron (B).

Polysilicon layer 3022 may be planarized using any conventional planarization techniques to obtain a planarized surface. Planarization techniques may include but is not limited to mechanical planarization or chemical mechanical planarization techniques. The chemical mechanical planarization process is more commonly used.

Next, referring to FIG. 3E, a portion of polysilicon layer 3022 is etched back, so that the upper surface of etched back polysilicon layer 3022 is lower than the surface of hardmask layer 301. The etch back can be performed using a wet etching or a dry etching process. In the embodiment, polysilicon layer 3022 is etched back using a dry etching process, which includes, but is not limited a reactive ion etching (ME), ion beam etching, plasma etching or laser cutting process. For example, the plasma etching may include an oxygen-based gas. In one embodiment, a relatively low RF energy and a low-pressure and high-density plasma etching gas can be used to perform the dry etching process. In an example embodiment, the plasma etching process may include an $O_2$-based gas, the etching gas flow in the range between 50 sccm and 150 sccm, the reaction chamber pressure in the range between 5 mTorr and 20 mTorr. The dry etching process may include a hydrogen bromide gas, carbon tetrafluoride gas, or nitrogen trifluoride gas. It is understood that the above-described etching processes are merely exemplary and are not limiting. Those of ordinary skill in the art will know of other suitable etching processes.

Next, hardmask layer 301 is removed, as shown in FIG. 3F. Hardmask layer 301 may be removed using either a wet etching or a dry etching process. The dry etching may be an anisotropic etch process based on a carbon fluoride gas. The wet etching may use a hydrofluoric acid solution, such as a buffer oxide etchant (BOE) or a buffer solution of hydrofluoric acid (BHF).

S404: a shallow trench isolation structure is formed in the semiconductor substrate between the active regions. The shallow trench isolation (STI) structure is disposed above the polysilicon in the deep trench that is located between adjacent pixel regions.

In one embodiment, forming the STI structure may include the following steps: sequentially forming a pad oxide layer 303 and a pad nitride layer 304 on the surface of semiconductor substrate 300 and polysilicon layer 3022, as shown in FIG. 3G. In one embodiment, pad oxide layer 303 may include silicon oxide, and pad nitride layer 304 may include silicon nitride.

Next, a portion of pad nitride layer 304, a portion of pad oxide layer 303 and a portion of semiconductor substrate 300 are removed by etching to form a shallow trench between the active regions, as shown in FIG. 3H. Removing a portion of the semiconductor substrate may include the removal of a portion of polysilicon layer 3022 in the deep trench between adjacent pixel regions. The semiconductor substrate portion can be etched to any suitable depth using any suitable etching methods known in the art, and is not limited to a wet etching or a dry etching process.

Next, still referring to FIG. 3H, an insulating material 305 is formed in the shallow trench covering pad nitride layer 304. Insulating material 304 may be any suitable insulating material including but not limited to silicon oxide, silicon nitride, silicon oxynitride, and the like. In the embodiment, pad nitride layer 304 includes a material formed by a high-density plasma (HDP) chemical vapor deposition process. Insulating material 305 may be formed using a chemical vapor deposition or a plasma chemical vapor deposition process. A planarization process is performed on insulation material 305 until a surface of pad nitride layer 304 is exposed. The planarization may be any suitable planarization process, preferably a chemical mechanical polishing process.

Next, pad nitride layer 304 is removed to form a shallow trench isolation structure 305, as shown in FIG. 3I. Pad nitride layer 304 may be removed using a wet etching process having a high etch selectivity relative to nitrides, e.g., pad nitride layer 304 is etched with a hot phosphoric acid.

S405: a plurality of well regions having the second conductivity type are formed in the semiconductor substrate; and one or more front end devices are formed on the semiconductor substrate in the active regions.

For example, the well regions can be formed by performing an ion implantation process know in the art. When the second conductivity type is the P-type, boron ions can be implanted into predetermined regions in the semiconductor substrate to form the P-type well regions. When the second conductivity type is the N-type, arsenic or phosphorus ions can be implanted into the predetermined regions in the semiconductor substrate to form the N-type well regions.

In one embodiment, prior to forming front end devices, a first conductivity type isolation well may be formed between adjacent pixel regions. The first conductivity type isolation well surrounds a portion of the deep trench and has a bottom higher than the bottom of the deep trench.

Front end devices may be formed using conventional CMOS manufacturing processes known in the art. In a CMOS image sensor, the front end devices may include a photodiode and a plurality of transistors in each pixel region (not shown). In one embodiment, the photodiode includes a second conductivity type well region and a first conductivity type doped region in the well region. The first and second conductivity types are opposite conductivity types. The well region and the doped region in the well region together form a PN junction region for the photodiode that generates photoelectrons from incident light.

Based on applications requirements, the number of transistors in each pixel region may vary. A four-transistor CMOS image sensor may include a photodiode and four transistors, e.g., a transfer transistor, a reset transistor, a drive transistor, and a select transistor. The CMOS image sensor may also include a floating diffusion region (not shown), which can receive electrons from the photodiode and converts electric charges into voltage signals.

The transfer transistor is adjacent the photodiode and includes a gate structure disposed on the semiconductor substrate. The gate structure may include a gate dielectric layer on the semiconductor substrate and a gate material layer on the gate dielectric layer. The gate structure may also include a spacer disposed on opposite sidewalls of the gate structure. The spacer may be formed using any conventional manufacturing techniques.

The reset transistor, the drive transistor, and the select transistor each include a gate structure formed on the semiconductor substrate, a source region and a drain region doped with the same conductivity type as well regions 2031 and disposed on opposite sides of the gate structure. In other words, the source and drain regions have a second conductivity type. In the embodiment, when the well regions are N-type, the source and drain regions are also N-type. In addition, a lightly doped drain (LDD) may also be formed in a region between the gate and the source and drain regions according to product specifications and functional requirements. Furthermore, a spacer may be formed on sidewalls of the gate structure.

The gate dielectric layer of each transistor may include any conventional dielectric material, e.g., silicon oxide, silicon nitride or silicon oxynitride having a dielectric constant of about 4 to 20 (measured in vacuum). The gate dielectric layer may also include dielectric materials having a higher dielectric constant in the range between about 20 to 100. The dielectric materials having such a high dielectric constant may include but not limited to hafnium oxide, hafnium silicate, titanium oxide, barium strontium titanate (BST), and lead zirconate titanate (PZT). The gate material layer may include a variety of materials including but not limited to metal, metal alloy, metal nitride and metal silicide, stacks and composites thereof. The gate material layer may also include doped polysilicon and polycrystalline silicon-germanium alloy (i.e., having a doping concentration of $1 \times 10^{18}$ atoms/cm$^3$ to about $1 \times 10^{22}$ atoms/cm$^3$) and polysilicon metal silicide (polycide) (a stack of doped polysilicon metal silicide layers). The gate material layer can be formed using conventional processes, as know in the art, preferably, chemical vapor deposition, e.g., low-pressure plasma enhanced chemical vapor deposition or plasma chemical vapor deposition process.

S406: a though hole is formed in the semiconductor substrate connecting to the polysilicon and the front end devices (not shown).

Referring to FIGS. 3J and 3K, prior to forming the through hole, a first dielectric layer 306 is formed on the semiconductor substrate and the front end devices (not shown). First dialectic layer 306 may include a silicon dioxide (SiO$_2$), fluorocarbon (CF), a carbon-doped silicon oxide (SiOC), silicon nitride, silicon nitride carbide (SiCN) based material. Alternatively, first dialectic layer 306 may include a SiCN film formed on the CF-based film. The CF-based film includes Fluorine (F) and carbon (C) as its main components. The CF-based film may also include an amorphous (non-crystalline) structure. First dialectic layer 306 may also be formed using, for example, carbon-doped silicon oxide (SiOC) and other porous materials by a chemical vapor deposition or other suitable deposition processes.

In one example embodiment, forming the through hole may include forming a patterned mask layer on first dielectric layer 306 defining the location and dimension of the through hole, etching the dielectric layer using the patterned mask layer as a mask. In order to connect through hole 307 to polysilicon 3022, a portion of shallow trench structure 305 on deep trench 302 is also removed until a surface of polysilicon 3022 is exposed. A metal material (e.g., copper, aluminum, or tungsten) is then filled in the through hole. In one embodiment, because a first through hole 307 connected to polysilicon 3022 and a second through hole 307 connected to the front end devices may have different depths, so that they will be etched separately.

S407: forming an metal interconnect layer 308 connecting the through holes 307.

Metal interconnect layer 308 may include multiple metal layers that are connected to each other through vias to form an interconnect structure, e.g., a copper interconnect structure. Metal interconnect layer 308 may be formed using various conventional interconnect techniques, e.g., using a damascene process.

In the above-description of the method of manufacturing a CMOS image sensor, when the first conductivity type is N-type, the second conductivity type is P-type. Conversely, when the first conductivity type is P-type, the second conductivity type is N-type.

Thus, a method for manufacturing a semiconductor device has been provided in detail in the above-described steps. It should be understood that the steps of the method 40 described herein are not inclusive and may include other intermediate steps and subsequent steps (not shown).

In accordance with the present invention, a CMOS image sensor includes a deep trench disposed between adjacent pixel regions and filled with a doped polysilicon. The deep trench completely isolates adjacent pixel regions, so that excess photoelectrons generated by intensive incident light will be collected by the doped polysilicon and will not impact the adjacent pixel regions. In addition, the excess photoelectrons in the doped polysilicon will be extracted away by a predetermined voltage applied to a metal interconnect structure that is connected to the doped polysilicon through one or more through holes, thereby improving the performance of the CMOS image sensor.

From the above description, it can be seen that embodiments of the present invention provide the following advantages: forming a deep trench between adjacent pixel regions, where the deep trench is filled with a doped polysilicon layer. The doped polysilicon layer collects excess photoelectrons that are generated by an intensive light source. An applied voltage to a metal interconnect structure connected to the doped polysilicon layer causes the photoelectrons to be extracted away from the doped polysilicon layer, so that the performance of the CMOS image sensor can be improved.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although a deep trench is shown between two adjacent pixel regions, it is understood that the number of deep trenches and pixel regions can be more than two in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A CMOS image sensor comprising:
   a semiconductor substrate;
   a plurality of pixel regions in the semiconductor substrate;
   a deep trench disposed between two adjacent pixel regions and configured to isolate the two adjacent pixel regions;
   a polysilicon layer having a first conductivity type filling the deep trench;
   a plurality of well regions separated from each other and having a second conductivity type in each of the two adjacent pixel regions, the first and second conductivity types being opposite conductivity types;
   an isolation well having the first conductivity type and disposed on opposing lateral sides of the polysilicon layer and configured to isolate the two adjacent pixel regions, each of the two adjacent pixel regions comprising a photodiode comprising a second conductivity type well region and a first conductivity type doped region over the second conductivity type well region, wherein the isolation well is not in contact with the photodiodes of the two adjacent pixel regions, wherein a lateral width of the second conductivity type well region is smaller than a lateral width of the first conductivity type doped region;
a dielectric layer on the semiconductor substrate;
a through hole extending through the dielectric layer and connected to the polysilicon layer, the through hole being filled with an electrically conductive material; and
a metal interconnect layer connected to the through hole and to one of the plurality of well regions.

2. The CMOS image sensor of claim 1, further comprising:
a shallow trench isolation structure disposed on an upper portion of the deep trench.

3. The CMOS image sensor of claim 2, wherein the through hole passes through the shallow trench isolation structure.

4. The CMOS image sensor of claim 1, wherein the isolation well has a bottom lower than a bottom of the second conductivity type well region.

5. The CMOS image sensor of claim 2, wherein the isolation well surrounds a lower portion of the shallow trench isolation structure, a portion of the deep trench, and an upper portion of the polysilicon layer, the isolation well having a bottom that is higher than a bottom of the deep trench.

6. The CMOS image sensor of claim 1, wherein the deep trench has a depth in a range between 2 microns and 3 microns.

7. The CMOS image sensor of claim 1, wherein the pixel regions each comprise at least one transistor.

8. The CMOS image sensor of claim 1, further comprising:
a liner layer disposed on a bottom and sidewalls of the deep trench.

9. The CMOS image sensor of claim 1, wherein the metal interconnect layer is connected to a voltage source configured to extract away excess photoelectrons in the polysilicon layer.

10. The CMOS image sensor of claim 1, further comprising a liner layer on sidewalls of the deep trench and surrounding a portion of the polysilicon layer.

11. The CMOS image sensor of claim 1, further comprising a liner layer disposed between the isolation well and the polysilicon layer.

12. The CMOS image sensor of claim 2, further comprising a liner layer formed on a bottom and sidewalls of the polysilicon layer and below the shallow trench isolation structure.

13. The CMOS image sensor of claim 10, wherein the liner layer comprises silicon oxide.

14. The CMOS image sensor of claim 1, wherein the electrically conductive material comprises copper, aluminum, or tungsten.

15. The CMOS image sensor of claim 1, wherein the dielectric layer comprises carbon-doped silicon oxide (SiOC) or silicon nitride carbide (SiCN).

* * * * *